(12) United States Patent
Ishikawa et al.

(10) Patent No.: US 11,124,673 B2
(45) Date of Patent: Sep. 21, 2021

(54) INSULATING FILM

(71) Applicant: MITSUBISHI MATERIALS CORPORATION, Tokyo (JP)

(72) Inventors: Fumiaki Ishikawa, Naka (JP); Kazuhiko Yamasaki, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/300,158

(22) PCT Filed: Jun. 27, 2017

(86) PCT No.: PCT/JP2017/023544
§ 371 (c)(1),
(2) Date: Nov. 9, 2018

(87) PCT Pub. No.: WO2018/025538
PCT Pub. Date: Feb. 8, 2018

(65) Prior Publication Data
US 2019/0144706 A1    May 16, 2019

(30) Foreign Application Priority Data

Aug. 1, 2016  (JP) ............... JP2016-151222
Mar. 23, 2017 (JP) ............... JP2017-057816

(51) Int. Cl.
| | | |
|---|---|---|
| C09D 179/08 | (2006.01) |
| C08L 79/08 | (2006.01) |
| H05K 3/28 | (2006.01) |
| H05K 1/05 | (2006.01) |
| C09D 7/61 | (2018.01) |
| C08G 73/10 | (2006.01) |
| C08J 5/18 | (2006.01) |
| C08K 3/22 | (2006.01) |
| C08K 3/36 | (2006.01) |
| C08K 3/38 | (2006.01) |
| H01B 3/30 | (2006.01) |
| H05K 1/03 | (2006.01) |
| C08K 9/02 | (2006.01) |

(52) U.S. Cl.
CPC ....... *C09D 179/08* (2013.01); *C08G 73/1071* (2013.01); *C08J 5/18* (2013.01); *C08K 3/22* (2013.01); *C08K 3/36* (2013.01); *C08K 3/38* (2013.01); *C08L 79/08* (2013.01); *C09D 7/61* (2018.01); *H01B 3/305* (2013.01); *H01B 3/306* (2013.01); *H05K 1/0373* (2013.01); *H05K 1/05* (2013.01); *H05K 3/28* (2013.01); *C08J 2379/08* (2013.01); *C08J 2479/08* (2013.01); *C08K 9/02* (2013.01); *C08K 2003/2227* (2013.01); *C08K 2003/2241* (2013.01); *C08K 2003/385* (2013.01); *C08K 2201/006* (2013.01); *H05K 2201/0154* (2013.01)

(58) Field of Classification Search
None
See application file for complete search history.

(56) References Cited

U.S. PATENT DOCUMENTS

| | | | |
|---|---|---|---|
| 2007/0116976 A1 | 5/2007 | Tan et al. | |
| 2014/0234617 A1 | 8/2014 | Masaki et al. | |
| 2014/0349105 A1* | 11/2014 | Yamazaki | C08G 59/4042 428/323 |
| 2016/0152794 A1 | 6/2016 | Diaham et al. | |
| 2019/0074104 A1* | 3/2019 | Kasagi | H01B 3/48 |

FOREIGN PATENT DOCUMENTS

| | | |
|---|---|---|
| CN | 103881312 A | 6/2014 |
| CN | 103897406 A | 7/2014 |
| JP | 2000-331539 A | 11/2000 |
| JP | 2007-141507 A | 6/2007 |
| JP | 2009-013227 A | 1/2009 |
| JP | 2013-057057 A | 3/2013 |
| JP | 2013-060575 A | 4/2013 |
| JP | 2013-159748 A | 8/2013 |
| JP | 2014-156545 A | 8/2014 |
| JP | 2016-044288 A | 4/2016 |
| JP | 2016-115431 A | 6/2016 |
| JP | 2017-057098 A | 3/2017 |
| WO | 2015/004115 A1 | 1/2015 |

OTHER PUBLICATIONS

Machine Translation of JP 2007-141507 A Yamauchi et al. (Year: 2007).*
Office Action dated Jun. 24, 2019, issued for the Chinese patent application No. 201780031656.1 and English translation thereof.
Toshikastu Tanaka et al., "Toward High Thermal Conductivity Nano Micro Epoxy Composites with Sufficient Endurance Voltage," Journal of International Council on Electrical Engineering, vol. 2, No. 1, 2012, pp. 90-98 and a cover page. (discussed in the spec).
International Search Report dated Aug. 15, 2017, issued for PCT/JP2017/023544 and English translation thereof.
Supplementary European Search Report dated Feb. 21, 2020, issued for European Patent Application No. 17836645.6.
Decision of Dismissal of Amendment dated Apr. 13, 2021, issued for Japanese Patent Application No. 2017-057816 and English translation therefo.

* cited by examiner

*Primary Examiner* — Robert T Butcher
(74) *Attorney, Agent, or Firm* — Locke Lord LLP

(57) ABSTRACT

An insulating film of the present invention includes a resin formed of polyimide, polyamide-imide, or a mixture thereof, and ceramic particles having a specific surface area of 10 $m^2/g$ or more, in which the ceramic particles form aggregated particles and a content of the ceramic particles is in a range of 5 vol % or more and 60 vol % or less.

5 Claims, 1 Drawing Sheet

INSULATING FILM

TECHNICAL FIELD

The present invention relates to an insulating film.

Priority is claimed on Japanese Patent Application No. 2016-151222, filed on Aug. 1, 2016, and Japanese Patent Application No. 2017-057816, filed on Mar. 23, 2017, the contents of which are incorporated herein by reference.

BACKGROUND ART

Insulating films are, for example, used as coating films of metal wires used for coils or motors, protective films for protecting the surfaces of electronic parts such as semiconductor chips and LED elements or circuit boards, or insulating materials between circuit layers and substrates in metal base circuit boards or the like.

As insulating films, films formed from a resin composition including a resin and an inorganic filler are used. As the resin, resins having high heat resistance, chemical resistance, and mechanical strength such as polyimide and polyamide-imide are used.

Along with the recent increases in the operating voltage and the integration of electronic parts, the amount of heat generated by the electronic parts has tended to increase, and there is a demand for insulating films with low thermal resistance and high heat dissipation properties (coils, heat dissipating substrates, thermal conductive materials (TIM), and the like). As a method of reducing the thermal resistance of the insulating film, there is a method of adding an inorganic filler having high thermal conductivity. However, when an inorganic filler with large particles is added to the insulating film, there is a problem in that the withstand voltage (dielectric breakdown voltage) decreases (Non-Patent Document 1).

Here, when the film thickness of the insulating film is h and the withstand voltage per film thickness is $V_F$, a withstand voltage $V_R$ of the insulating film is represented by Formula (1).

$$V_R = V_F \times h \quad (1)$$

On the other hand, when the film thickness of the insulating film is h and the thermal conductivity of the insulating film is $\lambda$, a thermal resistance R of the insulating film is represented by Formula (2).

$$R \propto h/\lambda \quad (2)$$

From Formulas (1) and (2), it is possible to express the thermal resistance R of the insulating film using Formula (3).

$$R \propto V_R/(\lambda \times V_F) \quad (3)$$

From the above Formula (3), it is understood that the thermal resistance R of the insulating film is proportional to the reciprocal of the withstand voltage $V_F$ per film thickness of the insulating layer×thermal conductivity $\lambda$. Accordingly, in order to reduce the thermal resistance R of the insulating film, it is important to increase the value of the withstand voltage $V_F$ per film thickness of the insulating layer×the thermal conductivity $\lambda$ (also referred to below as the "performance value").

Patent Documents 1 and 2 describe the use of nanoparticles as an inorganic filler in order to improve the withstand voltage of the insulating film.

Patent Document 1 discloses an insulating film using nanoparticles having an average maximum diameter of 500 nm or less as an inorganic filler. In the example of Patent Document 1, an insulating film to which 2.5% by mass or 5% by mass of nanoparticles is added is described.

Patent Document 2 discloses an insulating film including a polyamide-imide resin and insulating fine particles having an average primary particle diameter of 200 nm or less. In the example of Patent Document 2, an insulating film to which 5% by mass of insulating fine particles is added is described. However, even if nanoparticles are added to an insulating film, the thermal conductivity is generally not particularly improved.

Patent Documents 3 and 4 describe insulating films in which both nanoparticles and microparticles are used together as inorganic fillers in order to further improve thermal conductivity.

Patent Document 3 discloses a resin composition for an electrical insulating material containing a first inorganic filler of a microparticle size and a second inorganic filler of a nanoparticle size formed of a predetermined material, as inorganic fillers.

Patent Document 4 discloses a resin composition filled with a thermally conductive inorganic spherical microfiller of a microparticle size or a microfiller with a plate shape, a rod shape, a fibrous shape, or a scaly shape, and a thermally conductive inorganic nanofiller of a nanoparticle size, as inorganic fillers.

However, as described in Non-Patent Document 1 above, the insulating film to which microparticles are added has a problem in that the withstand voltage is lowered.

CITATION LIST

Non-Patent Literature

[Non-Patent Document 1] Journal of International Council on Electrical Engineering Vol. 2, No. 1, pp. 90 to 98, 2012

PATENT LITERATURE

[Patent Document 1] United States Patent Application, Publication No. 2007/0116976

[Patent Document 2] Japanese Unexamined Patent Application, First Publication No. 2013-60575

[Patent Document 3] Japanese Unexamined Patent Application, First Publication No. 2009-13227

[Patent Document 4] Japanese Unexamined Patent Application, First Publication No. 2013-159748

SUMMARY OF INVENTION

Technical Problem

The present invention has been made in view of the above circumstances, and an object of the present invention is to provide an insulating film which has both high thermal conductivity and a high withstand voltage, and which is also excellent in heat resistance, chemical resistance, and mechanical properties.

Solution to Problem

In order to solve the problems described above, an insulating film which is one aspect of the present invention includes a resin formed of polyimide, polyamide-imide, or a mixture thereof, and ceramic particles having a specific surface area of 10 m²/g or more, in which the ceramic particles form aggregated particles and a content of the ceramic particles is in a range of 5 vol % or more and 60 vol % or less.

According to the insulating film with this configuration, since the resin is formed of polyimide, polyamide-imide, or a mixture thereof, the heat resistance, chemical resistance, and mechanical properties are improved.

In addition, since fine ceramic particles having a specific surface area of 10 $m^2/g$ or more are included, the withstand voltage is improved and the withstand voltage is not easily lowered even if a large amount of the ceramic particles is added.

Furthermore, since the fine ceramic particles form aggregated particles, heat is easily conducted between the primary particles of the ceramic particles and it is easy to make a thermally conductive network structure. Therefore, the thermal conductivity of the insulating film is improved.

Since the content of the ceramic particles is in the range of 5 vol % or more and 60 vol % or less, it is possible to further improve the withstand voltage and the thermal conductivity without deteriorating the excellent heat resistance, chemical resistance, and mechanical properties of polyimide and polyamide-imide.

Here, in the insulating film which is one aspect of the present invention, a resin layer formed of polyimide, polyamide-imide, or a mixture thereof is preferably provided on at least one surface of the insulating film.

In such a case, for example, when fixing an insulating film and an object to be fixed, it is possible to interpose a resin layer therebetween, thus, it is possible to bring the insulating film and the object to be fixed into strong close contact with each other and to reduce thermal resistance between the insulating film and the object to be fixed. In addition, when the insulating film is used as a coating film of a metal wire (enameled wire) for a coil or a motor, two overlapping insulating films are formed between enameled wires wound in a coil shape, but it is possible to interpose a resin layer between these two overlapping insulating films, thus, it is possible to bring the two overlapping insulating films into strong close contact with each other and to lower the thermal resistance between the two overlapping insulating films. Due to this, it is possible to reduce the thermal resistance at the layer interface between enameled wires wound in a coil shape.

Advantageous Effects of Invention

According to the present invention, it is possible to provide an insulating film which has both high thermal conductivity and a high withstand voltage, and which is excellent in heat resistance, chemical resistance, and mechanical properties.

DESCRIPTION OF EMBODIMENTS

Figure 1:
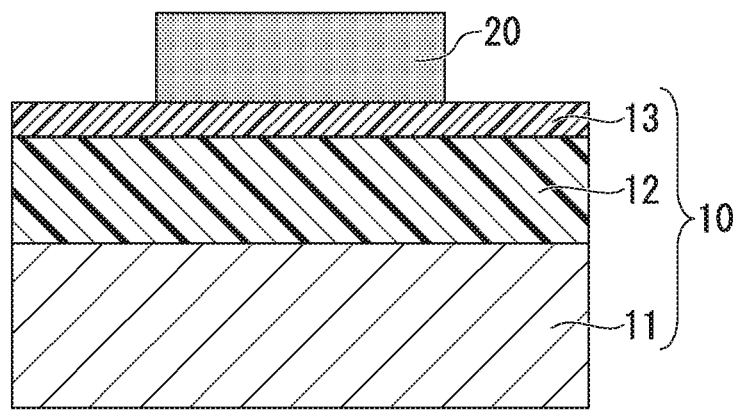
FIG. 1 is a schematic diagram showing a state in which a heating element is arranged in a laminate produced in Examples.

A description will be given below of an insulating film which is one embodiment of the present invention.

For example, it is possible to use the insulating film which is the present embodiment as an insulating coating film of a metal wire used for a coil or a motor such as an enamel film of an enameled wire. In addition, for example, use is possible as a protective film for protecting the surfaces of electronic parts and circuit boards. Furthermore, use is possible as an insulating film arranged between a circuit layer and a substrate in a metal base circuit board or the like. In addition, as a single sheet or film, use is possible as an insulating material for a circuit board such as a flexible printed board.

The insulating film according to the present embodiment includes a resin formed of polyimide, polyamide-imide, or a mixture thereof, and ceramic particles having a specific surface area of 10 $m^2/g$ or more. The ceramic particles form aggregated particles. In addition, the content of the ceramic particles is in the range of 5 vol % or more and 60 vol % or less. The reasons why the composition of the insulating film according to the present embodiment are defined as described above will be explained below.

(Resin)

The resin to be used in the insulating film of the present embodiment is a base material of the insulating film. Since polyimide and polyamide-imide have imide bonds, polyimide and polyamide-imide have excellent heat resistance and mechanical properties.

Therefore, in the present embodiment, polyimide, polyamide-imide, or a mixture thereof is used as the resin.

The weight average molecular weight of the polyamide-imide and the polyimide is preferably 100,000 or more, and is more preferably in a range of 100,000 or more and 500,000 or less. An insulating film including polyamide-imide or polyimide having a weight average molecular weight in the above range has further improved heat resistance and mechanical properties.

(Ceramic Particles)

The ceramic particles to be used in the insulating film of the present embodiment have an effect of efficiently improving the performance value of the insulating film.

Here, if the specific surface area of the ceramic particles is excessively small, that is, if the particle diameter of the primary particles of the ceramic particles is excessively large, there is a concern that the withstand voltage of the insulating film may be lowered.

Therefore, in the present embodiment, the specific surface area of the ceramic particles is set to 10 $m^2/g$ or more. In order to reliably improve the thermal conductivity of the insulating film, the specific surface area of the ceramic particles is preferably 50 $m^2/g$ or more.

If the specific surface area of the ceramic particles is excessively large, that is, if the particle diameter of the primary particles of the ceramic particles is excessively small, there is a concern that the ceramic particles will tend to form excessively large aggregated particles and the surface roughness Ra of the insulating film will be large. When the surface roughness Ra of the insulating film is excessively large, a contact area with the surface of an electronic part, a circuit board, or the like is narrow, the insulating film is easily peeled off from the electronic part, the circuit board, or the like, and there is a concern that there may be problems such as that the dissipation of the heat generated on the electronic parts or circuit board to the outside through the insulating film becomes difficult. Therefore, the surface roughness Ra of the insulating film is preferably small. In order to not excessively increase the surface roughness Ra of the insulating film, the specific surface area of the ceramic particles is preferably 300 $m^2/g$ or less.

The specific surface area of the ceramic particles is the BET specific surface area measured by the BET method. It is possible to measure the specific surface area of the ceramic particles in the insulating film by heating the insulating film, thermally decomposing and removing the resin component, and recovering the remaining ceramic particles.

The BET diameter of the ceramic particles calculated using the following formula from the BET specific surface area and the density is preferably in a range of 1 nm or more and 200 nm or less. An insulating film including ceramic particles having a BET diameter within the above range has a further improved withstand voltage.

BET diameter=6/(density×BET specific surface area)

The ceramic particles form aggregated particles. The aggregated particles may be agglomerates in which primary particles are relatively weakly linked, or aggregates in which primary particles are relatively strongly linked. In addition, particle clusters in which aggregated particles are further clustered may be formed. Due to the primary particles of the ceramic particles forming aggregated particles and being dispersed in the insulating film, a network is formed by mutual contact between the ceramic particles, heat is easily conducted between the primary particles of the ceramic particles, and the thermal conductivity of the insulating film is improved.

The aggregated particles of the ceramic particles preferably have an anisotropic shape in which the primary particles are connected in point contact. In this case, the primary particles of the ceramic particles are preferably chemically strongly bonded to each other.

In addition, the average particle diameter of the aggregated particles is preferably 5 times or more with respect to the BET diameter described above, and more preferably in a range of 5 times or more and 100 times or less. In addition, the average particle diameter of the aggregated particles is preferably in a range of 20 nm or more and 500 nm or less. When the average particle diameter of the aggregated particles is within the above range, it is possible to reliably improve the thermal conductivity of the insulating film.

The average particle diameter of the aggregated particles is the Dv50 value measured by a laser diffraction type particle diameter distribution measuring apparatus after the ceramic particles are subjected to ultrasonic dispersion together with a dispersing agent in an NMP solvent. It is possible to recover the aggregated particles (ceramic particles) in the insulating film by heating the insulating film and thermally decomposing and removing the resin component.

The content of the ceramic particles in the insulating film is set to 5 vol % or more and 60 vol % or less. If the content of the ceramic particles is excessively small, there is a concern that the thermal conductivity of the insulating film may not be sufficiently improved. On the other hand, if the content of the ceramic particles is excessively large, that is, the resin content relatively decreases, there is a concern that it may not be possible to stably maintain the shape of the insulating film. In addition, the ceramic particles tend to form excessively large aggregated particles and there is a concern that the surface roughness Ra of the insulating film may increase.

In order to reliably improve the thermal conductivity of the insulating film, the content of the ceramic particles is preferably 10 vol % or more. In addition, in order to reliably improve the stability of the shape of the insulating film and lower the surface roughness Ra, the content of the ceramic particles is preferably 50 vol % or less.

Examples of ceramic particles include silica (silicon dioxide) particles, alumina (aluminum oxide) particles, boron nitride particles, titanium oxide particles, alumina doped silica particles, and alumina hydrate particles. As the ceramic particles, one type may be used alone, or two or more types may be used in combination. Among these ceramic particles, alumina particles are preferable from the viewpoint of high thermal conductivity.

As the ceramic particles, commercially available products may be used. It is possible to use commercially available products of silica particles such as AE50, AE130, AE200, AE300, AE380, and AE90E (all manufactured by Nippon Aerosil CO., LTD.), T400 (manufactured by Wacker Chemie AG), and SFP-20M (Denka Company Limited), alumina particles such as Alu 65 (manufactured by Nippon Aerosil CO., LTD.), boron nitride particles such as AP-170S (manufactured by Maruka Corporation Ltd.), titanium oxide particles such as Aeroxide® TiO2 P90 (manufactured by Nippon Aerosil CO., LTD.), alumina doped silica particles such as MOX 170 (manufactured by Nippon Aerosil CO., LTD.), and alumina hydrate particles manufactured by Sasol.

(Resin Layer)

A resin layer may be provided on at least one surface of the insulating film according to the present embodiment. The resin layer is preferably formed of polyimide, polyamideimide, or a mixture thereof.

Since the resin layer has high affinity with the resin forming the base material of the insulating film and does not contain ceramic particles in the layer, the resin layer is easily deformed in comparison with the insulating film. Therefore, for example, when fixing the insulating film and the object to be fixed (for example, a heating element such as an electronic part or a circuit board, a conductor such as a metallic foil of a circuit copper foil), it is possible to interpose the resin layer therebetween, thus, it is possible to bring the insulating film and the object to be fixed into strong close contact. Due to this, the peel strength between the insulating film and the object to be fixed is improved. In addition, it is possible to lower the thermal resistance between the insulating film and the object to be fixed.

In addition, in a case where the insulating film is used as a coating film of a metal wire used for a coil or a motor, two overlapping insulating films are formed between metal wires (enameled wires) wound in a coil shape, but since it is possible to interpose a resin layer between the two overlapping insulating films, it is possible to bring the two overlapping insulating films into strong contact with each other. Due to this, the peel strength between the two overlapping insulating films is improved. In addition, since it is possible to lower the thermal resistance between the two overlapping insulating films, it is possible to reduce the thermal resistance at the layer interface between enameled wires wound in a coil shape.

The thickness of the resin layer is preferably in a range of 0.1 μm or more and 2 μm or less. When the thickness of the resin layer is in the above range, it is possible to reliably increase the close contact between the insulating film and the object to be fixed as well as between the two overlapping insulating films, and it is possible to reliably lower the thermal resistance between the insulating film and the object to be fixed and between the two overlapping insulating films. If the thickness of the resin layer is excessively thin, there is a concern that the close contact between the insulating film and the object to be fixed and between the two overlapping insulating films may decrease. On the other hand, if the thickness of the resin layer is excessively thick, there is a concern that the thermal resistance may be increased.

(Method of Producing Insulating Film)

It is possible to produce the insulating film according to the present embodiment by, for example, preparing a ceramic particle dispersed resin solution in which polyimide, polyamide-imide, or a precursor thereof are dissolved in a solvent and in which ceramic particles having a specific surface area of 10 $m^2/g$ or more and forming aggregated particles are dispersed and then forming a film shape using the ceramic particle dispersed resin solution. Examples of the solvent include aprotic polar solvents such as N-methyl-2-pyrrolidone (NMP), diglyme, triglyme, γ-butyrolactone, dimethylsulfoxide (DMSO), and mixtures thereof.

It is possible to prepare the ceramic particle dispersed resin solution by a method of mixing a resin solution in which polyimide, polyamide-imide, or a precursor thereof is dissolved in a solvent with ceramic particles and dispersing the ceramic particles in the resin solution. In addition, it is possible to prepare the ceramic particle dispersed resin solution by mixing a ceramic particle dispersion in which ceramic particles are dispersed in a solvent and polyimide, polyamide-imide, or a precursor thereof to dissolve the polyimide, polyamide-imide, or precursor thereof in the ceramic particle dispersion. Furthermore, it is also possible to prepare the ceramic particle dispersed resin solution by mixing a resin solution in which polyimide, polyamide-imide, or a precursor thereof is dissolved in a solvent and a ceramic particle dispersion in which ceramic particles are dispersed in a solvent.

As a method for producing the insulating film on the substrate, it is possible to use, for example, an electrodeposition method and a coating method.

In the electrodeposition method, an electrodeposition coating method is used in which electrodeposited matter is formed on a substrate using an electrodeposition solution prepared by adding water to a ceramic particle dispersed resin solution, and then the electrodeposited matter is heated, dried, and cured to produce an insulating film.

In addition, in the coating method, a ceramic particle dispersed resin solution is coated onto a substrate to form a coating film, and then the coating film is dried to form a dry film, and then heated and cured to produce an insulating film.

It is possible to obtain a film-like or sheet-like insulating film, for example, by coating a ceramic particle dispersed resin solution on a release film to form a coating film, then drying the coating film, and then peeling the dry film from the release film, and thereafter curing the dry film by a heating treatment.

It is possible to produce an insulating film provided with a resin layer, for example, as follows.

A resin material for forming the resin layer and a solvent are mixed to dissolve the resin material to prepare a resin solution. Next, the resin solution is coated on the insulating film to form a coating layer. Then, the coating layer is heated and dried.

Examples of the solvent for dissolving the resin material include aprotic polar solvents such as N-methyl-2-pyrrolidone (NMP), diglyme, triglyme, γ-butyrolactone, and dimethylsulfoxide (DMSO), or mixed solutions thereof. As a method for coating the resin solution on the insulating film, it is possible to use an immersion method, a spin coating method, a bar coating method, a knife coating method, a roll coating method, a blade coating method, a die coating method, a gravure coating method, or the like.

According to the insulating film of the present embodiment having the above structure, since the resin is formed of polyimide, polyamide-imide, or a mixture thereof, the heat resistance and mechanical properties are improved. In addition, since fine ceramic particles having a specific surface area of 10 $m^2/g$ or more are included, the withstand voltage is improved. Furthermore, since the fine ceramic particles form aggregated particles, heat is easily conducted between the primary particles of the ceramic particles, and the thermal conductivity of the insulating film is improved.

Since the content of the ceramic particles is in the range of 5 vol % or more and 60 vol % or less, it is possible to further improve the withstand voltage and the thermal conductivity without deteriorating the excellent heat resistance and mechanical properties of polyimide and polyamide-imide.

In addition, in the insulating film of the present embodiment, it is possible to adopt a structure in which a resin layer formed of polyimide, polyamide-imide, or a mixture thereof is provided on at least one surface. Due to this, for example, when the insulating film and the object to be fixed are fixed, it is possible to interpose a resin layer therebetween, thus, it is possible to bring the insulating film and the object to be fixed into strong close contact with each other, and to lower the thermal resistance between the insulating film and the object to be fixed. In addition, when the insulating film is used as a coating film of a metal wire (enameled wire) for a coil or motor, two overlapping insulating films are formed between enameled wires wound in a coil shape, but it is possible to interpose a resin layer between these two overlapping insulating films, thus, it is possible to bring the two overlapping insulating films into strong close contact with each other and it is possible to lower the thermal resistance between the two overlapping insulating films. Due to this, it is possible to reduce the thermal resistance at the layer interface between the enameled wires wound in a coil shape.

Although an embodiment of the present invention was described in detail above, the specific configurations thereof are not limited to that the present embodiment and include designs and the like within a range not deviating from the gist of the present invention.

EXAMPLES

A detailed description will be given below of effects of the present invention using Examples and Comparative Examples, but the present invention is not limited to the following Examples.

Examples 1-1 to 1-18, Comparative Examples 1-1 to 1-5

<Preparation of Ceramic Particle Dispersed Resin Solution>

Ceramic particles described in Table 1 below were prepared. The specific surface area shown in Table 1 is the BET specific surface area measured by the BET method. The average particle diameter of the aggregated particles is the Dv50 value measured by a laser diffraction type particle diameter distribution measuring apparatus after the aggregated particles are subjected to ultrasonic dispersion together with a dispersing agent in an N-methyl-2-pyrrolidone (NMP) solvent.

1 g of the prepared ceramic particles was added to a mixed solvent including 62.5 g of NMP, 10 g of 1M2P (1-methoxy- 2-propanol), and 0.22 g of amino ether (AE), and subjected to an ultrasonic treatment for 30 minutes to prepare a ceramic particle dispersion.

Next, a ceramic particle dispersion was added to 3.3 g of the polyamide-imide solution such that the ceramic particle concentration was the value listed in the following Table 2 to prepare a ceramic particle dispersed resin solution. The ceramic particle concentration is the volume content of the ceramic particles with respect to the total volume of the polyamide-imide and the ceramic particles.

<Preparation of Electrodeposition Solution>

21 g of water was added dropwise to the ceramic particle dispersed resin solution while stirring the prepared ceramic particle dispersed resin solution at a rotation speed of 5000 rpm to prepare an electrodeposition solution.

<Production of Insulating Film by Electrodeposition Method>

Using the prepared electrodeposition solution and following the electrodeposition method, electrodeposited matter was formed on the surface of a 30 mm×20 mm copper plate with a thickness of 0.3 mm by applying a DC voltage of 100 V such that the film thickness after heating was 10 µm. The film thickness was measured by embedding the copper plate on which the insulating film was produced into a resin and then observing a cross-section thereof with a laser microscope. Next, the electrodeposited matter was heated at 250° C. for 3 minutes in an air atmosphere to produce an insulating film having a thickness of 10 µm on the copper plate surface. With the electrodeposition solutions prepared in Comparative Examples 1-3 and 1-5, it was not possible to produce a uniform insulating film. In Table 2, a case where it was possible to produce the insulating film is denoted as "A", and a case where it was not possible to produce the insulating film is denoted as "B".

<Evaluation>

With respect to the insulating films produced in the above Examples and Comparative Examples, the content of ceramic particles, the withstand voltage per film thickness, the thermal conductivity (thermal conductivity in the thickness direction of the insulating film), the surface roughness Ra, and the insulation property at the time of bending were each measured by the following methods. The performance value (withstand voltage $V_F$ per film thickness×thermal conductivity $\lambda$) was calculated from the withstand voltage per film thickness and thermal conductivity. The results are shown in Table 2. Here, for the withstand voltage per film thickness, the thermal conductivity, and the performance value, relative values were given for which the values of a polyamide-imide film, which had a film thickness of 10 µm produced in the same manner as in Example 1-1 except that no ceramic particles were added thereto, were set as 1.

(Ceramic Particle Content)

The insulating film was peeled off from the copper plate and cut into a predetermined size to prepare a sample. Using this sample, the content (mass %) of the ceramic particles of the insulating film was measured by thermogravimetric analysis (TG).

Then, the value of the content of the ceramic particles was converted into vol % using the density of the ceramic particles and polyamide-imide shown below.

(Withstand Voltage Per Film Thickness)

The withstand voltage per film thickness was measured using a multifunctional safety tester 7440 manufactured by Keisoku Giken Co., Ltd. An electrode plate was placed on the surface of the insulating film opposite to the copper plate (substrate) side. The copper plate (substrate) and the electrode plate were each connected to the power source and pressed for 30 seconds at up to 6000 V. The voltage at the time when the current value flowing between the copper plate and the electrode plate reached 5000 µA was divided by the film thickness of the insulating film and this value was set as the withstand voltage per film thickness.

(Thermal Conductivity)

The thermal conductivity (thermal conductivity in the thickness direction of the insulating film) was measured by a laser flash method using LFA 477 Nanoflash manufactured by NETZSCH-Geratebau GmbH. For the measurement, a two-layer model was used without considering thermal resistance at the layer interface. The thickness of the copper plate was set to 0.3 mm as described above and the thermal diffusivity of the copper plate was set to 117.2 mm$^2$/sec. For calculation of the thermal conductivity of the insulating film, the following were used: the density of the silica particles was 2.2 g/cm$^3$, the specific heat of the silica particles was 0.76 J/gK, the density of the alumina particles was 3.89 g/cm$^3$, the specific heat of the alumina particles was 0.78 J/gK, the density of the boron nitride was 2.1 g/cm$^3$, the specific heat of the boron nitride was 0.8 J/gK, the density of the titanium oxide was 3.98 g/cm$^3$, the specific heat of the titanium oxide was 0.689 J/gK, the density of 1% alumina doped silica was 2.2 g/cm$^3$, the specific heat of 1% alumina doped silica was 0.76 J/gK, the density of the alumina hydrate was 3.07 g/cm$^3$, the specific heat of the alumina hydrate was 1.02 J/gK, the density of the polyimide was 1.4 g/cm$^3$, the specific heat of the polyimide was 1.13 J/gK, the density of the polyamide-imide resin was 1.41 g/cm$^3$, and the specific heat of the polyamide-imide resin was 1.09 J/gK.

(Surface Roughness Ra)

The surface roughness Ra was measured with a 1 mm scan using Dektak 150 manufactured by Bruker Nano. The load was 5.00 mg and the scan speed was 1 mm/30 s.

(Insulation Property at the Time of Bending)

The insulation property (flexibility) at the time of bending was evaluated by performing a pinhole test found in JIS C 3216-5 before and after bending the substrate. A copper plate (sample) on which an insulating film was produced and a copper substrate prepared by overlapping two copper plates with a thickness of 0.3 mm were laminated such that the copper plate of the sample and the copper substrate were in contact with each other to produce a laminate. The prepared laminate was bent along the thickness of the laminate and then returned to the original state. Thereafter, the laminated plate and a separately prepared stainless steel plate were immersed in an aqueous solution of sodium chloride (concentration: 0.2%) into which a phenolphthalein solution was added dropwise, and the copper substrate of the laminate was used as a negative electrode and the stainless steel plate was used as a positive electrode, a 12 V DC voltage was applied thereto for 1 minute to confirm the presence or absence of pinholes generated in the insulating film, that is, defects penetrating from the surface of the insulating film to the copper plate (JIS C 3216-5). In a case where one reddish purple streak (an aggregation of small bubbles) caused by the phenolphthalein was observed on the surface of the insulating film, it was judged that there was a pinhole and that it was not possible to preserve the insulation property after bending (no flexibility), and this case is set as "B". In a case where no reddish purple streak was confirmed on the surface of the insulating film, it was judged that there was no pinhole, and that it was possible to preserve the insulation property after bending (having flexibility), and this case is set as "A".

TABLE 1

| | Material | Specific surface area (m²/g) | Density (g/cm³) | BET diameter (nm) | Average particle diameter of aggregated particles (nm) | Average particle diameter of aggregated particles/BET diameter | Resin Material |
|---|---|---|---|---|---|---|---|
| Example 1-1 | Silica | 200 | 2.2 | 13.6 | 200 | 14.7 | Polyamide-imide |
| Example 1-2 | Alumina | 65 | 3.95 | 23.4 | 200 | 8.6 | Polyamide-imide |
| Example 1-3 | Boron nitride | 170 | 2.1 | 16.8 | 50 | 3.0 | Polyamide-imide |
| Example 1-4 | Titanium oxide | 50 | 4.23 | 28.4 | 200 | 7.1 | Polyamide-imide |
| Example 1-5 | Alumina 1% doped silica | 170 | 2.2 | 16.0 | 200 | 12.5 | Polyamide-imide |
| Example 1-6 | Alumina hydrate | 240 | 3.07 | 8.1 | 20 | 2.5 | Polyamide-imide |
| Example 1-7 | Silica | 90 | 2.2 | 30.3 | 200 | 6.6 | Polyamide-imide |
| Example 1-8 | Silica | 400 | 2.2 | 6.8 | 300 | 44.0 | Polyamide-imide |
| Example 1-9 | Silica | 200 | 2.2 | 13.6 | 200 | 14.7 | Polyamide-imide |
| Example 1-10 | Silica | 200 | 2.2 | 13.6 | 200 | 14.7 | Polyamide-imide |
| Example 1-11 | Silica | 200 | 2.2 | 13.6 | 200 | 14.7 | Polyamide-imide |
| Example 1-12 | Silica | 200 | 2.2 | 13.6 | 200 | 14.7 | Polyamide-imide |
| Example 1-13 | Silica | 200 | 2.2 | 13.6 | 200 | 14.7 | Polyamide-imide |
| Example 1-14 | Alumina | 65 | 3.95 | 23.4 | 200 | 8.6 | Polyamide-imide |
| Example 1-15 | Alumina | 65 | 3.95 | 23.4 | 200 | 8.6 | Polyamide-imide |
| Example 1-16 | Alumina | 65 | 3.95 | 23.4 | 200 | 8.6 | Polyamide-imide |
| Example 1-17 | Alumina | 65 | 3.95 | 23.4 | 200 | 8.6 | Polyamide-imide |
| Example 1-18 | Alumina | 65 | 3.95 | 23.4 | 200 | 8.6 | Polyamide-imide |
| Comparative Example 1-1 | Alumina | 9 | 3.95 | 168.8 | 200 | 1.2 | Polyamide-imide |
| Comparative Example 1-2 | Silica | 200 | 2.2 | 13.6 | 200 | 14.7 | Polyamide-imide |
| Comparative Example 1-3 | Silica | 200 | 2.2 | 13.6 | 200 | 14.7 | Polyamide-imide |
| Comparative Example 1-4 | Alumina | 65 | 3.95 | 23.4 | 200 | 8.6 | Polyamide-imide |
| Comparative Example 1-5 | Alumina | 65 | 3.95 | 23.4 | 200 | 8.6 | Polyamide-imide |

TABLE 2

| | Ceramic particle dispersed resin solution | | Insulating film | | | | | |
|---|---|---|---|---|---|---|---|---|
| | Ceramic particles concentration (vol %) | Film formation possible | Ceramic particles content (vol %) | Withstand voltage per film thickness (relative value) | Thermal conductivity (relative value) | Performance value (relative value) | Surface roughness (μm) | Insulation property at the time of bending |
| Example 1-1 | 25 | A | 25 | 1.01 | 2.44 | 2.46 | 0.2 | A |
| Example 1-2 | 25 | A | 25 | 1.06 | 2.81 | 2.98 | 0.3 | A |
| Example 1-3 | 25 | A | 25 | 0.99 | 1.32 | 1.31 | 0.2 | A |
| Example 1-4 | 25 | A | 25 | 0.97 | 2.12 | 2.06 | 0.3 | A |
| Example 1-5 | 25 | A | 25 | 1.03 | 2.05 | 2.11 | 0.3 | A |
| Example 1-6 | 25 | A | 25 | 1.02 | 1.58 | 1.61 | 0.2 | A |
| Example 1-7 | 25 | A | 25 | 1.00 | 1.78 | 1.78 | 0.3 | A |
| Example 1-8 | 25 | A | 25 | 1.04 | 1.58 | 1.64 | 0.9 | A |
| Example 1-9 | 8 | A | 8 | 1.10 | 1.17 | 1.29 | 0.2 | A |
| Example 1-10 | 20 | A | 20 | 1.05 | 1.46 | 1.53 | 0.2 | A |
| Example 1-11 | 30 | A | 30 | 1.03 | 2.01 | 2.07 | 0.3 | A |
| Example 1-12 | 50 | A | 50 | 1.01 | 2.21 | 2.23 | 0.3 | A |
| Example 1-13 | 60 | A | 60 | 0.98 | 2.56 | 2.51 | 0.8 | B |
| Example 1-14 | 8 | A | 8 | 1.15 | 1.32 | 1.52 | 0.2 | A |
| Example 1-15 | 20 | A | 20 | 1.12 | 1.84 | 2.06 | 0.2 | A |
| Example 1-16 | 30 | A | 30 | 1.06 | 2.67 | 2.83 | 0.3 | A |
| Example 1-17 | 50 | A | 50 | 1.05 | 3.30 | 3.47 | 0.4 | A |
| Example 1-18 | 60 | A | 60 | 0.98 | 4.21 | 4.13 | 1 | B |
| Comparative Example 1-1 | 25 | A | 25 | 0.82 | 1.45 | 1.19 | 0.2 | A |
| Comparative Example 1-2 | 4 | A | 4 | 1.17 | 1.00 | 1.17 | 0.1 | A |
| Comparative Example 1-3 | 70 | B | | Not possible to form an insulating film | | | | |
| Comparative Example 1-4 | 4 | A | 4 | 1.17 | 0.99 | 1.16 | 0.1 | A |
| Comparative Example 1-5 | 70 | B | | Not possible to form an insulating film | | | | |

In the insulating film of Comparative Example 1-1, the performance value was as low as 1.19 times. This is presumed to be because the specific surface area of the ceramic particles was less than 10 m²/g and the withstand voltage was lowered.

The performance values of the insulating films of Comparative Examples 1-2 and 1-4 were also approximately 1.17 times and 1.16 times. This is because the thermal conductivity was as low as that of the polyamide-imide film including no filler. The low thermal conductivity is presumed to be because the content of the ceramic particles was less than 5 vol %.

With the electrodeposition solutions prepared in Comparative Examples 1-3 and 1-5, it was not possible to produce an insulating film. This is presumed to be because the content of ceramic particles exceeded 60 vol %.

On the other hand, for the insulating films of Examples 1-1 to 1-18, the performance value was from 1.29 to a maximum of 4.13, and it was found that the performance was greatly improved. This is because, with respect to the withstand voltage, the thermal conductivity was improved to almost equal to or better than that of the polyamide-imide film including no filler and both the thermal conductivity and withstand voltage were excellent. In Example 1-8, the surface roughness Ra was slightly higher. This is presumed to be because the specific surface area of the ceramic particles was slightly large. In addition, in Examples 1-13 and 1-18, the surface roughness Ra was slightly high and the insulation property at the time of bending was "B". This is presumed to be because the content of ceramic particles was slightly large.

Examples 2-1 to 2-31, Comparative Examples 2-1 to 2-16

(Synthesis of Polyamic Acid)
4,4'-diaminodiphenyl ether and NMP were charged into a 300 mL capacity separable flask. The amount of NMP was adjusted such that the concentration of the obtained polyamic acid was 40 wt %. After stirring at normal temperature to completely dissolve the 4,4'-diaminodiphenyl ether, a predetermined amount of tetracarboxylic acid dianhydride was added little by little such that the internal temperature did not exceed 30° C. Thereafter, stirring was continued for 16 hours in a nitrogen atmosphere to obtain a polyamic acid solution.

(Preparation of Ceramic Particle Dispersed Resin Solution)
The ceramic particles described in Table 3 below were prepared. 1.0 g of the prepared ceramic particles were added to 10 g of NMP and subjected to an ultrasonic treatment for 30 minutes to prepare a ceramic particle dispersion.

Subsequently, the polyamic acid solution, the ceramic particle dispersion, and the NMP were mixed such that the polyamic acid concentration in the solution was finally 5% by mass and the ceramic particle concentration had the value shown in Table 4 below. Subsequently, the obtained mixture was subjected to a dispersing treatment by repeating a high-pressure injection treatment at a pressure of 50 MPa 10 times using Starburst manufactured by Sugino Machine Limited, to prepare a ceramic particle dispersed resin solution.

<Production of Insulating Film by Coating Method>
The prepared ceramic particle dispersed resin solution was coated on the surface of a 30 mm×20 mm copper plate with a thickness of 0.3 mm such that the film thickness after heating was 10 μm to form a coating film Next, the coating film was arranged on a hot plate, the temperature was raised from room temperature to 60° C. at 3° C./min, heated at 60° C. for 100 minutes, further increased to 120° C. at 1° C./min, and heated at 120° C. for 100 minutes to carry out drying to obtain a dry film. Thereafter, the dry film was heated at 250° C. for 1 minute and at 400° C. for 1 minute to produce an insulating film with a thickness of 10 μm on the copper plate surface. With the ceramic particle dispersed resin solutions prepared in Comparative Examples 2-3, 2-5, 2-7, 2-9, and 2-16, it was not possible to produce an insulating film.

<Evaluation>
With respect to the insulating films produced in the above Examples and Comparative Examples, the content of the ceramic particles, the withstand voltage per film thickness, the thermal conductivity (thermal conductivity in the thickness direction of the insulating film), the performance value, the surface roughness Ra, and the insulation property at the time of bending were each measured by the methods described above. The results are shown in Table 4. For the withstand voltage per film thickness, the thermal conductivity, and the performance value, relative values were given for which the values of a polyimide film, which had a film thickness of 10 which was produced in the same manner as in Example 2-1 except that no ceramic particles were added thereto, were set as 1.

TABLE 3

| | | | Ceramic particles | | | | | |
| --- | --- | --- | --- | --- | --- | --- | --- | --- |
| | | Material | Specific surface area (m²/g) | Density (g/cm³) | BET diameter (nm) | Average particle diameter of aggregated particles (nm) | Average particle diameter of aggregated particles/BET diameter | Resin Material |
| Example | 2-1 | Silica | 200 | 2.2 | 13.6 | 200 | 14.7 | Polyimide |
| | 2-2 | Alumina | 65 | 3.95 | 23.4 | 200 | 8.6 | Polyimide |
| | 2-3 | Boron nitride | 170 | 2.1 | 16.8 | 50 | 3.0 | Polyimide |
| | 2-4 | Titanium oxide | 50 | 4.23 | 28.4 | 200 | 7.1 | Polyimide |
| | 2-5 | Alumina 1% doped silica | 170 | 2.2 | 16.0 | 200 | 12.5 | Polyimide |
| | 2-6 | Alumina hydrate | 240 | 3.07 | 8.1 | 20 | 2.5 | Polyimide |
| | 2-7 | Silica | 90 | 2.2 | 30.3 | 200 | 6.6 | Polyimide |
| | 2-8 | Silica | 400 | 2.2 | 6.8 | 300 | 44.0 | Polyimide |
| | 2-9 | Silica | 200 | 2.2 | 13.6 | 200 | 14.7 | Polyimide |
| | 2-10 | Silica | 200 | 2.2 | 13.6 | 200 | 14.7 | Polyimide |
| | 2-11 | Silica | 200 | 2.2 | 13.6 | 200 | 14.7 | Polyimide |

TABLE 3-continued

|  |  |  | Ceramic particles | | | | | |
|---|---|---|---|---|---|---|---|---|
|  |  | Material | Specific surface area (m²/g) | Density (g/cm³) | BET diameter (nm) | Average particle diameter of aggregated particles (nm) | Average particle diameter of aggregated particles/BET diameter | Resin Material |
|  | 2-12 | Silica | 200 | 2.2 | 13.6 | 200 | 14.7 | Polyimide |
|  | 2-13 | Silica | 200 | 2.2 | 13.6 | 200 | 14.7 | Polyimide |
|  | 2-14 | Alumina | 65 | 3.95 | 23.4 | 200 | 8.6 | Polyimide |
|  | 2-15 | Alumina | 65 | 3.95 | 23.4 | 200 | 8.6 | Polyimide |
|  | 2-16 | Alumina | 65 | 3.95 | 23.4 | 200 | 8.6 | Polyimide |
|  | 2-17 | Alumina | 65 | 3.95 | 23.4 | 200 | 8.6 | Polyimide |
|  | 2-18 | Alumina | 65 | 3.95 | 23.4 | 200 | 8.6 | Polyimide |
|  | 2-19 | Boron nitride | 170 | 2.1 | 16.8 | 50 | 3.0 | Polyimide |
|  | 2-20 | Boron nitride | 170 | 2.1 | 16.8 | 50 | 3.0 | Polyimide |
|  | 2-21 | Boron nitride | 170 | 2.1 | 16.8 | 50 | 3.0 | Polyimide |
|  | 2-22 | Boron nitride | 170 | 2.1 | 16.8 | 50 | 3.0 | Polyimide |
|  | 2-23 | Boron nitride | 170 | 2.1 | 16.8 | 50 | 3.0 | Polyimide |
|  | 2-24 | Silica | 50 | 2.2 | 54.5 | 300 | 5.5 | Polyimide |
|  | 2-25 | Silica | 130 | 2.2 | 21.0 | 200 | 9.5 | Polyimide |
|  | 2-26 | Silica | 300 | 2.2 | 9.1 | 100 | 11.0 | Polyimide |
|  | 2-27 | Silica | 380 | 2.2 | 7.2 | 100 | 13.9 | Polyimide |
|  | 2-28 | Silica | 380 | 2.2 | 7.2 | 100 | 13.9 | Polyimide |
|  | 2-29 | Silica | 380 | 2.2 | 7.2 | 100 | 13.9 | Polyimide |
|  | 2-30 | Silica | 380 | 2.2 | 7.2 | 100 | 13.9 | Polyimide |
|  | 2-31 | Silica | 380 | 2.2 | 7.2 | 100 | 13.9 | Polyimide |
| Comparative Example | 2-1 | Alumina | 9 | 3.95 | 169 | 200 | 1.2 | Polyimide |
|  | 2-2 | Silica | 200 | 2.2 | 13.6 | 200 | 14.7 | Polyimide |
|  | 2-3 | Silica | 200 | 2.2 | 13.6 | 200 | 14.7 | Polyimide |
|  | 2-4 | Alumina | 65 | 3.95 | 23.4 | 200 | 8.6 | Polyimide |
|  | 2-5 | Alumina | 65 | 3.95 | 23.4 | 200 | 8.6 | Polyimide |
|  | 2-6 | Boron nitride | 170 | 2.1 | 16.8 | 50 | 3.0 | Polyimide |
|  | 2-7 | Boron nitride | 170 | 2.1 | 16.8 | 50 | 3.0 | Polyimide |
|  | 2-8 | Silica | 380 | 2.2 | 7.2 | 100 | 13.9 | Polyimide |
|  | 2-9 | Silica | 380 | 2.2 | 7.2 | 100 | 13.9 | Polyimide |
|  | 2-10 | Silica | 6.2 | 2.2 | 440 | 700 | 1.6 | Polyimide |
|  | 2-11 | Silica | 6.2 | 2.2 | 440 | 700 | 1.6 | Polyimide |
|  | 2-12 | Silica | 6.2 | 2.2 | 440 | 700 | 1.6 | Polyimide |
|  | 2-13 | Silica | 6.2 | 2.2 | 440 | 700 | 1.6 | Polyimide |
|  | 2-14 | Silica | 6.2 | 2.2 | 440 | 700 | 1.6 | Polyimide |
|  | 2-15 | Silica | 6.2 | 2.2 | 440 | 700 | 1.6 | Polyimide |
|  | 2-16 | Silica | 6.2 | 2.2 | 440 | 700 | 1.6 | Polyimide |

TABLE 4

|  | Ceramic particle dispersed resin solution | | Insulating film | | | | | |
|---|---|---|---|---|---|---|---|---|
|  | Ceramic particles concentration (vol %) | Film formation possible | Ceramic particles content (vol %) | Withstand voltage per film thickness (relative value) | Thermal conductivity (relative value) | Performance value (relative value) | Surface roughness (μm) | Insulation property at the time of bending |
| Example 2-1 | 25 | A | 25 | 1.05 | 2.32 | 2.44 | 0.2 | A |
| Example 2-2 | 25 | A | 25 | 1.04 | 2.76 | 2.87 | 0.3 | A |
| Example 2-3 | 25 | A | 25 | 1.03 | 1.45 | 1.49 | 0.2 | A |
| Example 2-4 | 25 | A | 25 | 0.98 | 2.53 | 2.48 | 0.3 | A |
| Example 2-5 | 25 | A | 25 | 1.01 | 1.99 | 2.01 | 0.3 | A |
| Example 2-6 | 25 | A | 25 | 1.00 | 1.52 | 1.52 | 0.2 | A |
| Example 2-7 | 25 | A | 25 | 1.05 | 1.89 | 1.98 | 0.3 | A |
| Example 2-8 | 25 | A | 25 | 1.07 | 1.68 | 1.80 | 0.9 | A |
| Example 2-9 | 8 | A | 8 | 1.15 | 1.19 | 1.37 | 0.2 | A |
| Example 2-10 | 20 | A | 20 | 1.09 | 1.58 | 1.72 | 0.2 | A |
| Example 2-11 | 30 | A | 30 | 1.08 | 2.18 | 2.35 | 0.3 | A |
| Example 2-12 | 50 | A | 50 | 1.04 | 2.36 | 2.45 | 0.3 | A |
| Example 2-13 | 60 | A | 60 | 0.99 | 2.81 | 2.78 | 0.8 | B |
| Example 2-14 | 8 | A | 8 | 1.14 | 1.28 | 1.46 | 0.2 | A |
| Example 2-15 | 20 | A | 20 | 1.09 | 1.73 | 1.89 | 0.2 | A |
| Example 2-16 | 30 | A | 30 | 1.03 | 2.58 | 2.66 | 0.3 | A |
| Example 2-17 | 50 | A | 50 | 1.01 | 3.29 | 3.32 | 0.4 | A |
| Example 2-18 | 60 | A | 60 | 0.97 | 4.01 | 3.89 | 1 | B |
| Example 2-19 | 8 | A | 8 | 1.02 | 1.31 | 1.34 | 0.2 | A |
| Example 2-20 | 20 | A | 20 | 0.96 | 1.42 | 1.36 | 0.2 | A |

TABLE 4-continued

|  | Ceramic particle dispersed resin solution | | Insulating film | | | | | |
|---|---|---|---|---|---|---|---|---|
|  | Ceramic particles concentration (vol %) | Film formation possible | Ceramic particles content (vol %) | Withstand voltage per film thickness (relative value) | Thermal conductivity (relative value) | Performance value (relative value) | Surface roughness (μm) | Insulation property at the time of bending |
| Example 2-21 | 30 | A | 30 | 0.95 | 1.48 | 1.41 | 0.3 | A |
| Example 2-22 | 50 | A | 50 | 0.91 | 1.62 | 1.47 | 0.4 | A |
| Example 2-23 | 60 | A | 60 | 0.81 | 1.71 | 1.39 | 0.7 | B |
| Example 2-24 | 25 | A | 25 | 1.14 | 1.42 | 1.62 | 0.2 | A |
| Example 2-25 | 25 | A | 25 | 1.25 | 1.68 | 2.10 | 0.3 | A |
| Example 2-26 | 25 | A | 25 | 1.09 | 1.66 | 1.81 | 0.4 | A |
| Example 2-27 | 8 | A | 8 | 1.23 | 1.18 | 1.45 | 0.6 | A |
| Example 2-28 | 20 | A | 20 | 1.07 | 1.58 | 1.69 | 0.7 | A |
| Example 2-29 | 30 | A | 30 | 1.01 | 1.92 | 1.94 | 0.8 | A |
| Example 2-30 | 50 | A | 50 | 0.96 | 2.30 | 2.21 | 1 | A |
| Example 2-31 | 60 | A | 60 | 0.89 | 2.49 | 2.22 | 1.2 | B |
| Comparative Example 2-1 | 25 | A | 25 | 0.78 | 1.40 | 1.09 | 0.2 | A |
| Comparative Example 2-2 | 4 | A | 4 | 1.20 | 0.99 | 1.19 | 0.1 | A |
| Comparative Example 2-3 | 70 | B | Not possible to form an insulating film | | | | | |
| Comparative Example 2-4 | 4 | A | 4 | 1.18 | 1.01 | 1.19 | 0.1 | A |
| Comparative Example 2-5 | 70 | B | Not possible to form an insulating film | | | | | |
| Comparative Example 2-6 | 4 | A | 4 | 0.98 | 1.00 | 0.98 | 0.1 | A |
| Comparative Example 2-7 | 70 | B | Not possible to form an insulating film | | | | | |
| Comparative Example 2-8 | 4 | A | 4 | 1.22 | 0.99 | 1.21 | 0.5 | A |
| Comparative Example 2-9 | 70 | B | Not possible to form an insulating film | | | | | |
| Comparative Example 2-10 | 4 | A | 4 | 1.02 | 0.99 | 1.01 | 0.1 | A |
| Comparative Example 2-11 | 8 | A | 8 | 0.94 | 1.01 | 0.95 | 0.2 | A |
| Comparative Example 2-12 | 20 | A | 20 | 0.91 | 1.08 | 0.98 | 0.3 | A |
| Comparative Example 2-13 | 30 | A | 30 | 0.83 | 1.19 | 0.99 | 0.3 | A |
| Comparative Example 2-14 | 50 | A | 50 | 0.76 | 1.32 | 1.00 | 0.4 | A |
| Comparative Example 2-15 | 60 | A | 60 | 0.69 | 1.45 | 1.00 | 0.8 | B |
| Comparative Example 2-16 | 70 | B | Not possible to form an insulating film | | | | | |

In the insulating films of Comparative Examples 2-1 and 2-13 to 15, the withstand voltage per film thickness was low. This is presumed to be because the specific surface area of the ceramic particles was less than 10 m²/g.

The insulating films of Comparative Examples 2-2, 2-4, 2-6, and 2-8 had the same thermal conductivity as a polyimide film including no filler. This is presumed to be because the content of the ceramic particles was less than 5 vol %.

In the insulating films of Comparative Examples 2-10 to 12, the withstand voltage per film thickness was the same or slightly lower than that of a polyimide film including no filler, the thermal conductivity was the same as that a polyimide film including no filler, and the effect of adding the ceramic particles was not obtained. This is presumed to be because the specific surface area of the ceramic particles was less than 10 m²/g and the content thereof was also small.

In the ceramic particle dispersed resin solutions prepared in Comparative Examples 2-3, 2-5, 2-7, 2-9, and 2-16, it was not possible to produce an insulating film. This is presumed to be because the content of ceramic particles exceeded 60 vol %.

In contrast, some of the insulating films of Examples 2-1 to 2-31 had a slightly lower withstand voltage per film thickness than the polyimide film including no filler, but the thermal conductivity was remarkably improved in comparison with a polyimide film including no filler, and as a result, the performance value was as high as 1.3 times or more. In Examples 2-8 and 2-27 to 30, the surface roughness Ra was slightly high. This is presumed to be because the specific surface area of the ceramic particles was slightly large. In addition, in Examples 2-13, 2-18, 2-23, and 2-31, the surface roughness Ra was slightly high and the insulation property at the time of bending was "B". This is presumed to be because the content of ceramic particles was slightly large.

Examples 3-1 to 3-22

A 20 mm×20 mm copper plate with a thickness of 1 mm was prepared. As shown in the following Table 5, an insulating film was formed on the prepared copper plate using the same ceramic particle dispersed resin solution and method as in Examples 1-1 to 1-6. The thickness of the obtained insulating film is shown in Table 5.

Subsequently, the resin material shown in Table 5 below and N-methyl-2-pyrrolidone (NMP) were mixed at a ratio such that the amount of NMP to 1 part by mass of the resin material was the amount shown in Table 5, and the resin material was dissolved to prepare a resin solution. The insulating film side surface of the copper plate with an attached insulating film was immersed in the resin solution, and the resin solution was coated on the surface of the insulating film Thereafter, the coated layer was heated and dried at 250° C. for 30 minutes to form a resin layer on the surface of the insulating film and to obtain a laminate in which the copper plate, the insulating film, and the resin layer were laminated in this order. The thickness of the obtained resin layer is shown in Table 5.

In Examples 3-21 to 3-22, no resin layer was formed.

<Evaluation>

The thermal resistance (one laminate sheet) of the laminates produced in Examples 3-1 to 3-22 was measured by the following method. Furthermore, with respect to the laminates produced in Examples 3-1 to 3-20, the thermal resistance and peel strength were measured by the following methods in a state where two sheets were overlapped via a resin layer. The results are shown in Table 5.

(Thermal Resistance: One Laminate Sheet)

As shown in FIG. 1, grease (not shown) was coated on a resin layer 13 of a laminate 10 in which a copper plate 11, an insulating film 12, and the resin layer 13 were laminated in this order, and a heating element 20 was placed on this grease. As the heating element 20, TO-3P was used. The thermal resistance from the heating element 20 to the copper plate 11 of the laminate was measured using T3Ster while pressing in the laminating direction from the upper part of the heating element with a screw with a torque of 40 N cm. The measurement conditions of thermal resistance were heat generation: 1 A, 30 sec (element temperature: ΔT=2.6° C.), measurement: 0.01 A, and measurement time: 45 seconds. The copper plate 11 was cooled by natural convection. The thermal resistance of Examples 3-21 to 3-22 in which no resin layer was formed was measured in the same manner as in Examples 3-1 to 3-20 except that a sample was used in which grease was coated on the insulating film of the laminate in which the insulating film was laminated on the copper plate and the heating element was placed on the grease. For the thermal resistance, a relative value was given for which the value of Example 3-21 was set as 1.

(Thermal Resistance: Two Overlapping Laminate Sheets)

Figure 2:
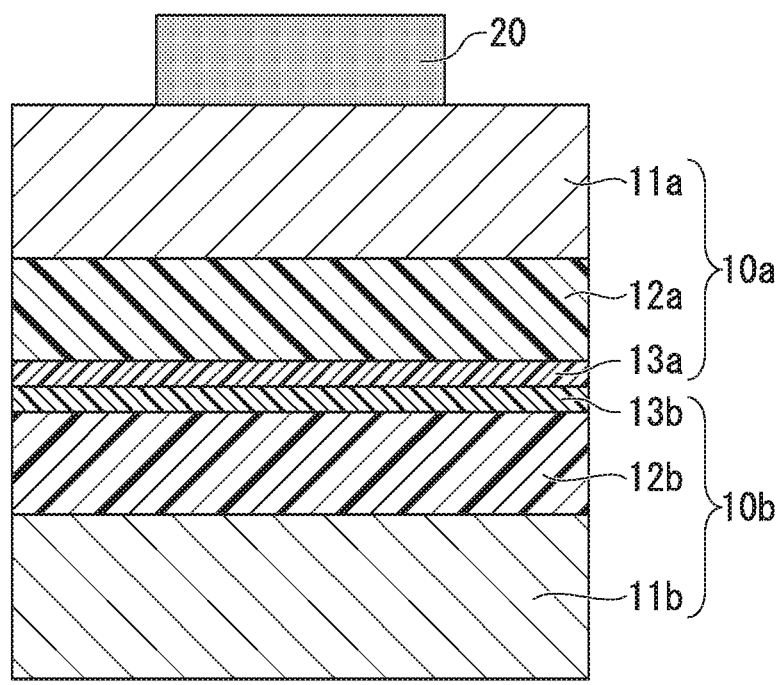
FIG. 2 is a schematic diagram showing a state in which a heating element is arranged on two overlapping laminates produced in Examples.

As shown in FIG. 2, a laminate 10a in which a copper plate 11a, an insulating film 12a, and a resin layer 13a were laminated in this order and a laminate 10b in which a copper plate 11b, an insulating film 12b, and a resin layer 13b were laminated in this order were prepared and overlapped such that the resin layers 13a and 13b of the laminates 10a and 10b were in contact with each other. The overlapping laminates 10a and 10b were heated at a temperature of 215° C. in a vacuum for 20 minutes while applying heat and a pressure of 5 MPa using a carbon jig, and bonded by thermocompression to produce a sample of two overlapping laminate sheets. Then, as shown in FIG. 2, grease (not shown) was coated on the copper plate 11a on the upper side of the sample, and the heating element 20 was placed on the grease. As the heating element 20, TO-3P was used. The thermal resistance from the heating element 20 to the copper plate 11b on the lower side of the sample was measured using T3Ster while pressing in the laminating direction from the upper part of the heating element 20 with a screw with a torque of 40 N cm. The measurement conditions of the thermal resistance were heat generation: 1 A, 30 sec (element temperature: ΔT=2.6° C.), measurement: 0.01 A, and measurement time: 45 seconds. The thermal resistances of Examples 3-21 to 3-22 in which no resin layer was formed were measured in the same manner as in Examples 3-1 to 3-20 except that a sample was used in which two laminates in which an insulating film was laminated on a copper plate were prepared and the insulating films of the laminates were overlapped in contact with each other. For the thermal resistance, a relative value was given for which the value of Example 3-21 was set as 1.

(Peel Strength)

A resin layer of a laminate and a copper foil having a thickness of 18 μm and a width of 1 cm (CF-T4X-SV-18: manufactured by Fukuda Metal Foil & Powder Co., Ltd.) were heated at 215° C. for 20 minutes in a vacuum and thermocompression bonded while applying heat and a pressure of 5 MPa using a carbon jig. Next, in accordance with JIS C 6481, the peel strength was measured when the copper foil was peeled from the resin layer of the laminate at an angle of 180 degrees at a peeling rate of 50 mm/min. As a measurement apparatus for the peel strength, a Tensilon Universal Material Testing Instrument (manufactured by A & D Co., Ltd.) was used.

TABLE 5

| | Insulating film | | | Resin layer | | Evaluation | | |
| | | | | | | One laminate sheet | Two overlapping laminate sheets | |
| | Manufacturing method | Thickness (μm) | Resin material | NMP amount with respect to 1 part by mass of resin material (parts by mass) | Thickness (μm) | Thermal resistance (relative value) | Thermal resistance (relative value) | Peel strength (relative value) |
|---|---|---|---|---|---|---|---|---|
| Example 3-1 | Manufacturing Method of Example 1-1 | 10 | Polyamide-imide | 50 | 0.05 | 1.02 | 0.70 | 4.5 |
| Example 3-2 | Manufacturing Method of Example 1-1 | 10 | Polyamide-imide | 40 | 0.1 | 1.03 | 0.60 | 6.2 |
| Example 3-3 | Manufacturing Method of Example 1-1 | 10 | Polyamide-imide | 30 | 0.5 | 1.11 | 0.56 | 7.5 |

TABLE 5-continued

| | Insulating film | | Resin layer | | | Evaluation | | |
|---|---|---|---|---|---|---|---|---|
| | | | | NMP amount with respect to 1 part by mass of resin material | | One laminate sheet | Two overlapping laminate sheets | |
| | Manufacturing method | Thickness (μm) | Resin material | (parts by mass) | Thickness (μm) | Thermal resistance (relative value) | Thermal resistance (relative value) | Peel strength (relative value) |
| Example 3-4 | Manufacturing Method of Example 1-1 | 10 | Polyamide-imide | 20 | 1 | 1.22 | 0.54 | 8.1 |
| Example 3-5 | Manufacturing Method of Example 1-1 | 10 | Polyamide-imide | 10 | 2 | 1.45 | 0.60 | 10.5 |
| Example 3-6 | Manufacturing Method of Example 1-1 | 10 | Polyamide-imide | 7 | 3 | 1.72 | 0.66 | 9.5 |
| Example 3-7 | Manufacturing Method of Example 1-1 | 20 | Polyamide-imide | 30 | 0.5 | 2.14 | 0.95 | 8.0 |
| Example 3-8 | Manufacturing Method of Example 1-2 | 10 | Polyamide-imide | 50 | 0.05 | 0.89 | 0.66 | 4.5 |
| Example 3-9 | Manufacturing Method of Example 1-2 | 10 | Polyamide-imide | 40 | 0.1 | 0.91 | 0.55 | 6.7 |
| Example 3-10 | Manufacturing Method of Example 1-2 | 10 | Polyamide-imide | 30 | 0.5 | 0.94 | 0.51 | 8.2 |
| Example 3-11 | Manufacturing Method of Example 1-2 | 10 | Polyamide-imide | 20 | 1 | 1.05 | 0.48 | 9.3 |
| Example 3-12 | Manufacturing Method of Example 1-2 | 10 | Polyamide-imide | 10 | 2 | 1.29 | 0.59 | 10.4 |
| Example 3-13 | Manufacturing Method of Example 1-2 | 10 | Polyamide-imide | 7 | 3 | 1.62 | 0.67 | 11.0 |
| Example 3-14 | Manufacturing Method of Example 1-2 | 20 | Polyamide-imide | 30 | 0.5 | 1.82 | 0.84 | 7.4 |
| Example 3-15 | Manufacturing Method of Example 1-3 | 10 | Polyamide-imide | 30 | 0.5 | 1.94 | 0.88 | 8.1 |
| Example 3-16 | Manufacturing Method of Example 1-4 | 10 | Polyamide-imide | 30 | 0.5 | 1.30 | 0.62 | 7.5 |
| Example 3-17 | Manufacturing Method of Example 1-5 | 10 | Polyamide-imide | 30 | 0.5 | 1.34 | 0.59 | 7.5 |
| Example 3-18 | Manufacturing Method of Example 1-6 | 10 | Polyamide-imide | 30 | 0.5 | 1.54 | 0.74 | 8.2 |
| Example 3-19 | Manufacturing Method of Example 1-1 | 10 | Polyimide | 30 | 0.7 | 1.10 | 0.58 | 9.5 |
| Example 3-20 | Manufacturing Method of Example 1-1 | 10 | Mixture of polyamide-imide and polyimide (mass ratio 1:1) | 30 | 0.6 | 1.11 | 0.57 | 7.5 |
| Example 3-21 | Manufacturing Method of Example 1-1 | 10 | — | — | — | 1 | 1 | 1 |
| Example 3-22 | Manufacturing Method of Example 1-1 | 20 | — | — | — | 1.95 | 1.21 | 1.1 |

Each of the laminates obtained in Examples 3-1 to 3-22 exhibited a low thermal resistance for each sheet. The laminates obtained in Examples 3-1 to 3-20 in which the resin layer was provided exhibited a low thermal resistance as one laminate and, at the same time, exhibited a high peel strength in addition to a low thermal resistance even in a case where two laminates were overlapped. In particular, the laminates obtained in Examples 3-2 to 3-5, 3-7, 3-9 to 3-12, and 3-14 to 3-20 in which the thickness of the resin layer was in a range of 0.1 μm or more and 2 μm or less exhibited both low thermal resistance and high peel strength at the same time.

Examples 4-1 to 4-22

Insulating films were formed on a copper plate in the same manner as in Examples 3-1 to 3-22 described above except that, as shown in the following Table 6, the insulating films were formed on a copper plate using the ceramic particle dispersed resin solutions and methods similar to those in Examples 2-1 to 2-6. The thicknesses of the obtained insulating films are shown in Table 6.

Next, laminates in which a resin layer was formed on the surface of an insulating film and a copper plate, the insulating film and the resin layer were laminated in this order were obtained in the same manner as in Examples 3-1 to 3-20 except that a resin solution was used in which the resin material shown in Table 6 below and N-methyl-2-pyrrolidone (NMP) were mixed at a ratio such that the amount of NMP to 1 part by mass of the resin material was the amount shown in Table 6, and the resin material was dissolved.

The thickness of the obtained resin layer is shown in Table 6.

In Examples 4-21 to 4-22, no resin layer was formed. In Examples 4-21 to 4-22, a laminate in which an insulating film was formed on a copper plate was obtained.

<Evaluation>

The thermal resistance (one laminate) of the laminates produced in Examples 4-1 to 4-22 was measured by the above method. Further, with respect to the laminates produced in Examples 4-1 to 4-20 above, the thermal resistance and peel strength were measured by the above method in a state where two sheets were overlapped via a resin layer. For the laminates produced in Examples 4-21 to 4-22 above, the thermal resistance and the peel strength were measured in a state where the two laminates were overlapped such that the insulating films of each laminate were in contact. The results are shown in Table 6.

TABLE 6

| | Insulating film | | Resin layer | | | Evaluation | | |
|---|---|---|---|---|---|---|---|---|
| | | | | NMP amount with respect to 1 part by mass of resin material | | One laminate sheet | Two overlapping laminate sheets | |
| | Manufacturing method | Thickness (μm) | Resin material | (parts by mass) | Thickness (μm) | Thermal resistance (relative value) | Thermal resistance (relative value) | Peel strength (relative value) |
| Example 4-1 | Manufacturing Method of Example 2-1 | 10 | Polyamide-imide | 50 | 0.05 | 1.05 | 0.69 | 5.1 |
| Example 4-2 | Manufacturing Method of Example 2-1 | 10 | Polyamide-imide | 40 | 0.1 | 1.04 | 0.59 | 6.4 |
| Example 4-3 | Manufacturing Method of Example 2-1 | 10 | Polyamide-imide | 30 | 0.5 | 1.09 | 0.55 | 7.9 |
| Example 4-4 | Manufacturing Method of Example 2-1 | 10 | Polyamide-imide | 20 | 1 | 1.25 | 0.54 | 8.1 |
| Example 4-5 | Manufacturing Method of Example 2-1 | 10 | Polyamide-imide | 10 | 2 | 1.50 | 0.58 | 10.0 |
| Example 4-6 | Manufacturing Method of Example 2-1 | 10 | Polyamide-imide | 7 | 3 | 1.81 | 0.64 | 9.4 |
| Example 4-7 | Manufacturing Method of Example 2-1 | 20 | Polyamide-imide | 30 | 0.5 | 2.16 | 0.94 | 8.2 |
| Example 4-8 | Manufacturing Method of Example 2-2 | 10 | Polyamide-imide | 50 | 0.05 | 0.89 | 0.65 | 4.8 |
| Example 4-9 | Manufacturing Method of Example 2-2 | 10 | Polyamide-imide | 40 | 0.1 | 0.95 | 0.55 | 6.9 |
| Example 4-10 | Manufacturing Method of Example 2-2 | 10 | Polyamide-imide | 30 | 0.5 | 1.00 | 0.51 | 8.5 |
| Example 4-11 | Manufacturing Method of Example 2-2 | 10 | Polyamide-imide | 20 | 1 | 1.12 | 0.47 | 9.4 |
| Example 4-12 | Manufacturing Method of Example 2-2 | 10 | Polyamide-imide | 10 | 2 | 1.35 | 0.57 | 10.0 |
| Example 4-13 | Manufacturing Method of Example 2-2 | 10 | Polyamide-imide | 7 | 3 | 1.70 | 0.67 | 10.8 |
| Example 4-14 | Manufacturing Method of Example 2-2 | 20 | Polyamide-imide | 30 | 0.5 | 1.91 | 0.86 | 7.2 |
| Example 4-15 | Manufacturing Method of Example 2-3 | 10 | Polyamide-imide | 30 | 0.5 | 2.01 | 0.84 | 8.5 |
| Example 4-16 | Manufacturing Method of Example 2-4 | 10 | Polyamide-imide | 30 | 0.5 | 1.38 | 0.60 | 7.4 |
| Example 4-17 | Manufacturing Method of Example 2-5 | 10 | Polyamide-imide | 30 | 0.5 | 1.41 | 0.60 | 7.7 |
| Example 4-18 | Manufacturing Method of Example 2-6 | 10 | Polyamide-imide | 30 | 0.5 | 1.60 | 0.78 | 8.3 |
| Example 4-19 | Manufacturing Method of Example 2-1 | 10 | Polyimide | 30 | 0.7 | 1.19 | 0.57 | 9.9 |
| Example 4-20 | Manufacturing Method of Example 2-1 | 10 | Mixture of polyamide-imide and polyimide (mass ratio 1:1) | 30 | 0.6 | 1.15 | 0.60 | 7.5 |
| Example 4-21 | Manufacturing Method of Example 2-1 | 10 | — | — | — | 1 | 1 | 1 |
| Example 4-22 | Manufacturing Method of Example 2-1 | 20 | — | — | — | 2.01 | 1.18 | 1.2 |

Each of the laminates obtained in Examples 4-1 to 4-22 exhibited a low thermal resistance for each sheet. The laminates obtained in Examples 4-1 to 4-20 in which the resin layer was provided exhibited a low thermal resistance as one laminate and, at the same time, exhibited a high peel strength in addition to a low thermal resistance even in a case where two laminates were overlapped. In particular, the laminates obtained in Examples 4-2 to 4-5, 4-7, 4-9 to 4-12, and 4-14 to 4-20 in which the thickness of the resin layer was in a range of 0.1 µm or more and 2 µm or less exhibited both low thermal resistance and high peel strength at the same time.

INDUSTRIAL APPLICABILITY

The insulating film of the present invention has both high thermal conductivity and a high withstand voltage and is excellent in heat resistance and mechanical properties. Therefore, the insulating film of the present invention is suitable for coating films of metal wires used for coils or motors, protective films for protecting the surfaces of electronic parts such as semiconductor chips and LED elements or circuit boards, insulating materials between circuit layers and substrates in metal base circuit board, or the like.

REFERENCE SIGNS LIST 10, 10a, 10b LAMINATE
11, 11a, 11b COPPER PLATE
12, 12a, 12b INSULATING FILM
13, 13a, 13b RESIN LAYER
20 HEATING ELEMENT

The invention claimed is:
1. An insulating film comprising:
a resin formed of polyimide, polyamide-imide, or a mixture thereof; and
ceramic particles having a specific surface area of 10 m$^2$/g or more,
wherein the ceramic particles form aggregated particles and a content of the ceramic particles is in a range of 20 vol % or more and 60 vol % or less,
the ceramic particles include silica particles, alumina particles, titanium oxide particles, alumina doped silica particles, and alumina hydrate particles,
a BET diameter of the ceramic particles calculated by following formula (1) is in a range of 6.8 or more and 30.3 nm or less, and
an average particle diameter of the aggregated particles is in a range of 5 times or more and 44 times or less with respect to the BET diameter of the ceramic particles,

$$\text{BET diameter} = 6/(\text{density} \times \text{BET specific surface area}) \qquad (1).$$

2. The insulating film according to claim 1,
wherein a resin layer formed of polyimide, polyamide-imide, or a mixture thereof is provided on at least one surface of the insulating film.
3. The insulating film according to claim 1,
wherein a network is formed by mutual contact between the aggregated particles.
4. The insulating film according to claim 2,
wherein a network is formed by mutual contact between the aggregated particles.
5. The insulating film according to claim 2,
wherein a thickness of the resin layer is in a range of 0.05 µm or more and 3 µm or less.

* * * * *